(12) United States Patent
Tripsas et al.

(10) Patent No.: US 6,355,933 B1
(45) Date of Patent: Mar. 12, 2002

(54) ION SOURCE AND METHOD FOR USING SAME

(75) Inventors: Nicholas H. Tripsas; Robert B. Ogle, Jr., both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/229,326

(22) Filed: Jan. 13, 1999

(51) Int. Cl.[7] .......................... H01J 37/08; H01J 37/317
(52) U.S. Cl. ............... 250/427; 250/423 R; 250/492.21
(58) Field of Search .................. 250/423 R, 427, 250/492.21

(56) References Cited

U.S. PATENT DOCUMENTS

| | | | |
|---|---|---|---|
| 4,578,589 A | 3/1986 | Aitken | 250/492.2 |
| 4,658,143 A * | 4/1987 | Tokiguchi et al. | 250/423 R |
| 4,883,969 A * | 11/1989 | Ishida et al. | 250/427 |
| 5,252,892 A | 10/1993 | Koshiishi et al. | 315/111.81 |
| 5,306,921 A | 4/1994 | Tanaka et al. | 250/492.21 |
| 5,554,854 A | 9/1996 | Blake | 250/492.21 |
| 5,656,820 A | 8/1997 | Murakoshi et al. | 250/492.21 |

* cited by examiner

Primary Examiner—Bruce Anderson

(57) ABSTRACT

Damaging forming deposits and etching is reduced in an ion source by introducing an oxygenated gas during operation of the ion source. Embodiments include an ion source in fluid communication with a source of oxygenated gas and introducing about 1% to about 10% of carbondioxide as the oxygenated gas together with a feed material.

17 Claims, 3 Drawing Sheets

ION SOURCE AND METHOD FOR USING SAME

TECHNICAL FIELD

The present invention relates to an ion source and a method of implanting ions therefrom into a semiconductor substrate. The present invention is particularly useful in extending the life of an ion source.

BACKGROUND ART

Conventional semiconductor devices comprise a substrate in which individual circuit components are formed and various interconnection patterning formed thereon. The formation of various circuit components and interconnection patterns is partly accomplished by employing conventional photolithography, etching and implantation techniques. The density of integrated circuits and their speed of operation are dependent largely upon the accuracy and resolution of the photolithography and etching apparatuses used to form patterns of circuit elements and masking layers on the semiconductor wafer. However, density and speed are also dependent upon achieving tight control of the profile of doped regions in the semiconductor substrate.

Ion implantation systems are conventionally employed to modify the electrical properties in a region of a semiconductor substrate by implanting an impurity dopant into the substrate which elicits the desired electrical modification. The type of dopant profiles, concentrations and lateral geometries required on a very large scale integration (VLSI) or ultra large scale integration (ULSI) make ion implantation the doping process most conducive to providing uniformity and repeatability thereby dramatically improving fabrication yields. Improved ion implantation systems has, therefore, become critical in the fabrication of higher integrated devices, e.g. devices having a design rule of about 0.25 $\mu$ and under.

FIG. 1 illustrates a conventional ion implantation system used for the manufacture of semiconductor devices. As shown in FIG. 1, the ion implantation system includes ion source 10, ion beam 12, beam-analyzing system 14, beam conditioning system 16 and implantation station 18. The process for implanting a particular ion into a semiconductor substrate begins by introducing a feed material to ion source 10 to generate an ionized gas (or plasma) of the feed material. The plasma generated by the ion source contains a mixture of ions from which the desired ion must be separated. Separation is typically achieved by extracting ions from the generated plasma, forming a beam of the extracted ions, shown as numeral 12, and accelerating the ion beam toward mass analyzing system 14, wherein the mixture of ions is separated based on mass to form a beam of particular ions for implantation. Beam conditioning system 16 resolves, focuses and accelerates the desired particular ions to implantation station 18 wherein a semiconductor substrate is targeted and the desired ions are implanted. A more complete description of ion implantation systems and their component parts can be found in U.S. Pat. Nos. 4,578,589 and 5,554,854.

A significant factor which determines throughput of semiconductor devices in an ion implanter is the generation of the ion beam itself. As discussed above, the ion beam is generated by an ion source which comprises an ionizing chamber having entrance and exit ports and a filament contained within the ionizing chamber for transferring electrons to a gaseous feed material introduced into the chamber thereby generating an ionized gas of the feed material. A more complete description of ion sources can be found in U.S. Pat. Nos. 5,252,892; 5,306,921 and 5,656,820 which are herein incorporated by reference.

Under normal operating conditions, however, the inner surfaces of an ion source are damaged from the generated plasma. In particular, ions, radicals and excited species of the plasma causes etching or sputtering of structural surfaces within the chamber. Vaporized metal material deposits on insulators and vaporized insulating materials deposit on electrically conductive element resulting in shorting, arcing and ultimate failure of the device. Moreover, the feed material itself generates undesirable polymeric deposits within the ion source further exacerbating device failure over a period of time. The problem is particularly acute in systems employing corrosive and/or highly fluorinated feed materials, such as $BF_3$ and $GeF_4$.

Conventional remedial procedures comprise routinely cleaning the ion source to remove or reduce damaging forming deposits on interior parts to prevent device failure. Removing contaminated materials from the ion source requires stopping the ion implantation system and replacing the contaminated ion source with a pre-cleaned source, which is commonly referred to as a "change-out". A change-out process, however, disrupts the manufacturing process in that the implantation operation must cease during the change-out procedure. In addition to stopping the implantation operation and replacing the contaminated ion source, precise alignment of the implantation system and conditioning of the interior atmosphere thereof must be achieved prior to resuming proper operation of the system. Typically, a complete change-out procedure can take up to eight hours. The change-out procedure represents a significant economic cost in terms of semiconductor through-put and down time. Further, the removed contaminated ion source must be disassembled, and the component parts cleaned and reassembled. The reconditioning of the ion source can take another additional eight hours further adding to the cost of operation.

Accordingly, a need exists for ion implantation methodologies in which damaging deposits generated during the operation of an ion source are reduced to prevent device failure. A need also exists for increasing the length of time that an ion source can be operated before requiring reconditioning.

SUMMARY OF THE INVENTION

An advantage of the present invention is an improved ion source. The improved ion source reduces damaging deposits and provides a longer operating beam time.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by an ion source comprising: an electrically conductive chamber for forming ions having at least two ports, wherein the first port allows the introduction of materials and the second port allows the escape of an ion; a filament in the electrically conductive chamber and insulated therefrom; a power source connected to the filament for generating an electrical discharge; and a source of oxygenated gas fluidly connected to the electrically conductive chamber for supplying an oxygenated gas to the chamber.

Another aspect of the present invention is a method of operating an ion source comprising a chamber and a filament contained therein. The method comprises supplying an oxygenated gas to the chamber. The method advantageously comprises operating the ion source for an extended beam time of no less than two times the normal operating beam time and up to a multiple of about five times or more the normal operating beam time.

A further aspect of the present invention is a method for reducing contaminant formation within an ion source comprising a chamber and a filament contained therein. The method comprises: reducing the pressure of the chamber to below atmospheric pressure; introducing a feed material to the chamber; introducing an oxygenated gas to the chamber; applying electrical power to the filament to form ions of the feed material; and reacting the oxygenated gas with contaminant forming deposits within the chamber. The method advantageously comprises reacting the oxygenated gas with polymer forming ions or radicals, or with metal forming deposits within the chamber thereby preventing damaging deposits from coating structural elements in the chamber and decreasing the life-time of the ion source.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The various features and advantages of the present invention will become more apparent as a detailed description of the embodiments thereof is given with reference to the appended figures described below.

DESCRIPTION OF THE INVENTION

The present invention addresses and solves the problem of reducing damaging deposits, which are generated in an ion source during conventional operation thereof by supplying an oxygenated gas to the ion source for reacting with deposit forming species. During operation of an ion source comprising a chamber and a filament contained therein, a feed material, from which a desired ion is selected, is introduced to the chamber and ionized by the application of electrical power to the filament. The ions formed in the chamber can react with the chamber, the filament or other structural elements contained within the chamber etching, vaporizing and re-depositing the vaporized structural materials. Moreover, the ions generated from the feed material itself can, in some instances, self polymerize forming a polymer deposit coating surfaces within the chamber. The redistribution of material and deposition of foreign material within the chamber and structural elements therein deleteriously reduces the performance of the ion source, particularly the length of time that the ion source can be operated to produce a beam of ions.

Figure 1:
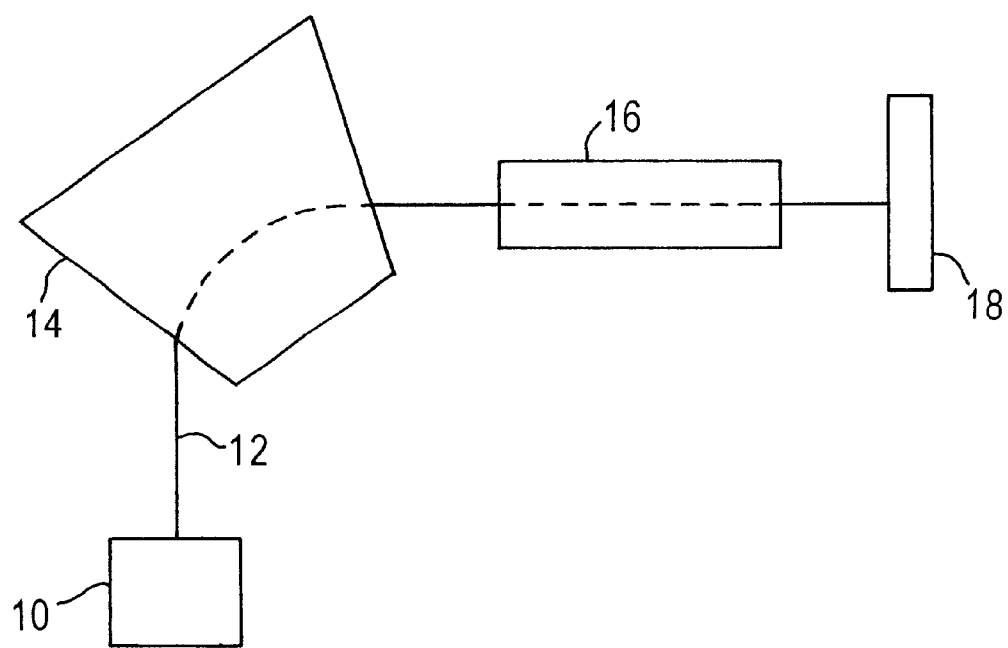
FIG. 1 is a drawing illustrating some of the components of a conventional ion implantation system.
Figure 2:
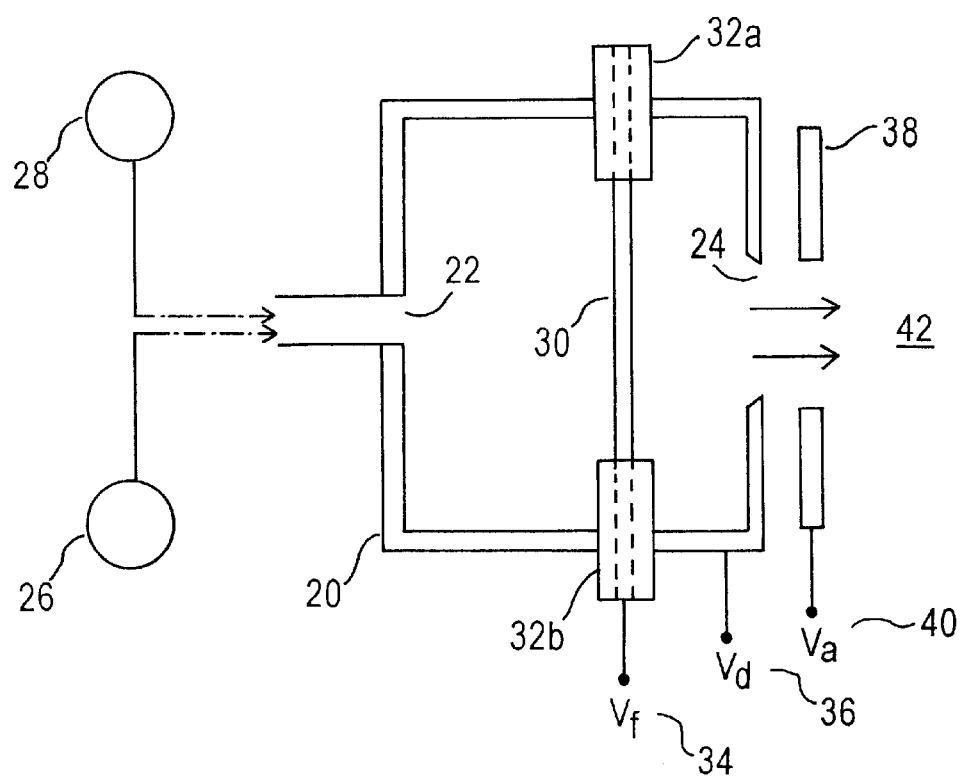
FIG. 2 illustrates an ion source of the present invention.

The present invention reduces or overcomes the undesirable deficiencies by employing an ion source comprising an electrically conductive chamber for forming ions having at least two ports, wherein the first port allows the introduction of materials and the second port allows the escape of ions, and an oxygenated gas source in fluid communication with the entrance port of the chamber for supplying an oxygenated gas. The present invention is not limited to the various arrangements of the components of an individual ion source but can be adapted to any ion source in need of improved efficiency. An embodiment of the present invention is illustrated in FIG. 2 and comprises a modified Freeman type ion source. As shown, the ion source comprises chamber 20 having two ports, entrance port 22 and exit port 24. Entrance port 22 is split to accommodate the introduction of a feed material from feed source 26 and the introduction of an oxygenated gas from oxygenated gas source 28. Filament 30 is contained within chamber 20 and insulated therefrom by insulators 32a and 32b. The opposing end of filament 30 is connected to a filament power supply 34 with voltage Vf while a discharge power supply, power supply 36 with voltage Vd, is connected to the wall of chamber 20. An ion extraction electrode 38 is disposed near port 24 and connected to another power supply 40 for attracting ions from the plasma generated within chamber 20, through port 24 and directing the drawn ions 42 downstream to strike a semiconductor target (not shown for illustrative convenience).

Chamber 20 is made of any suitable material that can hold and discharge a plasma The exit port can be shaped in any manner appropriate for the desired shape of the beam, such as a slit shape for an essentially longitudinal shaped beam or a circular type shape for an essentially circular shaped beam. Entrance port 22 can be designed to accommodate the oxygenated gas from source 28 and feed source 26 in fluid communication with the chamber. For example, disposed between source 28 and 26 can be one or more valves and one or more flow controllers for regulating the amount of feed material and/or oxygenated gas to the chamber and to regulate the relative amounts of the respective components to each other. When solid feed materials are to be used, an oven can be provided in communication with the chamber to generate heat to vaporize a solid feed material into a gas prior to its introduction to the chamber. Filament 30 typically comprises an electrically conductive material such as tungsten and is electrically isolated from the chamber by insulators 32a and 32b, typically made of a ceramic material.

Figure 3:
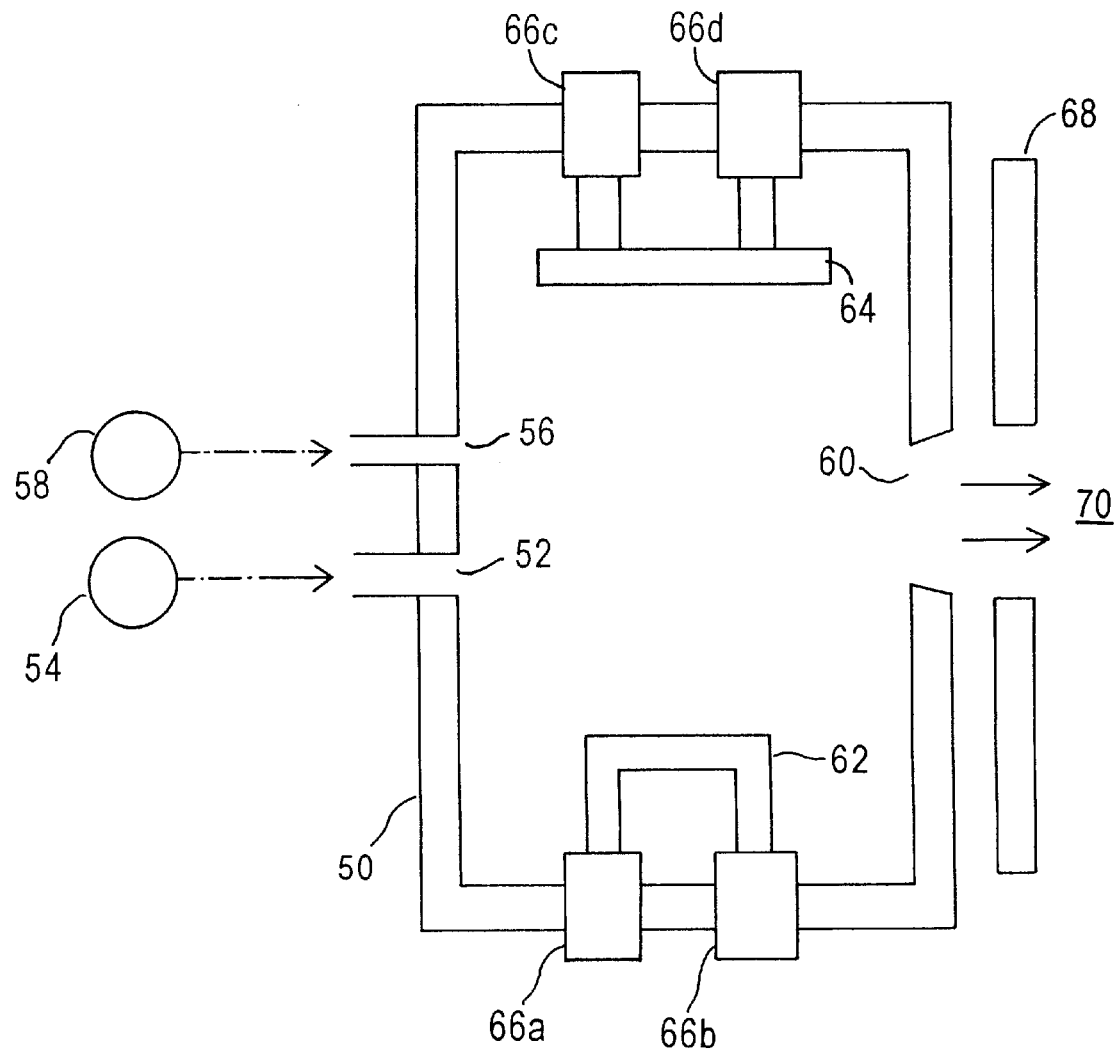
FIG. 3 is a diagram showing a separate embodiment of an ion source of the present invention.

Another embodiment of the present invention is illustrated in FIG. 3 and comprises a modified Bernas type ion source comprising chamber 50 having three ports: feed material entrance port 52, in fluid communication with feed source 54, oxygenated gas port 56 in fluid communication with oxygenated source 58 and exit port 60. In contrast to the FIG. 2 embodiment, an additional port is provided for the oxygenated gas demonstrating the versatility contemplated by the present invention in constructing an ion source adapted to receive an oxygenated gas from an oxygenated gas source. Filament 62 and its opposing electrode 64 are contained within chamber 50 and insulated therefrom by insulators 66a–66d. An ion extraction electrode 68 is disposed near port 60 for drawing ions 70 through the port.

In the manufacture of semiconductor devices, an ion source typically operates within an implantation system to generate a plasma. The implantation system separates unwanted materials from the system and guides a desired ion from the plasma to ultimately strike a semiconductor substrate. Practically any feed compound can be used in an ion source, however, gaseous materials are more convenient since they avoid the additional need for an oven or vaporization chamber. The more common feed materials for semiconductor manufacturing include feed materials that comprise boron, silicon, germanium, phosphorous, arsenic, antimony and their oxide and halide derivatives. For example, feed materials for semiconductor implantation typically include: B, $BF_3$, $BCl_3$, Si, $SiF_4$, $SiCl_4$, Ge, $GeF_4$, $GeCl_4$, P, $PF_3$, $PCl_3$, $PF_5$, As, $AsF_3$, $AsCl_3$, $AsF_5$, Sb, $SbF_3$, $Sb_2O_3$, However, $SiF_4$, and $GeF_4$ are most commonly used for amorphization of the semiconductor substrate.

Ionization of the feed material results in the formation of excited species which disassociate into fragments such as $MX_z$, where M is boron, silicon, germanium, phosphorous, or arsenic, X is hydrogen or a halogen and Z is an integer less than the full valence shell of M. For example, when germanium tetrafluoride is introduced into the chamber, the filament transfers electrons to $GeF_4$ ionizing it to Ge, GeF, $GeF_2$ and $GeF_3$ ions and radicals as well as forming $GeF_4$ excited species. The excited species, ions and radicals are known to etch or otherwise decompose the filament, insulators and chamber surfaces. Vaporized metal or other conductive material can deposit on insulators rendering them unsuited to insulate conductive elements thereby ceasing the operation of the ion source. Likewise, insulating materials, such as those formed by etching the insulator elements or by the formation of polymeric forming species from the ionized feed material can deposit on electrically conductive elements rendering the electrically conductive elements unsuitable for their intended function. Accordingly, ion sources are routinely cleaned and to remove damaging deposits and maintenance thereof is governed by several parameters, including operating pressure, applied voltages and currents, the feed material and power out-put. These various parameters establish the length of time that an ion source can be operated before requiring reconditioning, e.g. the normal operating beam time.

In accordance with the present invention, a method of increasing the length of time that an ion source can effectively operate before requiring maintenance under normal operating conditions is achieved by introducing an oxygenated gas to the chamber. By normal operation is meant operating the ion source without introducing an oxygenated gas. The present invention departs from conventional methodology by introducing an oxygenated gas concurrently or sequentially with the feed material. It was found, via experimentation and investigation, that introducing an oxygenated gas to an ion source yields a considerable improvement in the length of time that the ion source can be operated. In an embodiment of the present invention, an oxygenated gas is introduced either sequentially or concurrently with the feed material at a total gas flow of from about 0.5 sccm to about 5 sccm. For example, the addition of about 1% to about 10% by volume of the oxygenated gas can increase the beam time from about two fold up to about five or more times normal operation.

In practicing embodiments of the present invention, an ion source is operated by supplying an oxygenated gas, such as CO, $CO_2$, $SO_2$, NO, $N_2O$ or $O_2$. It is believed that the oxygenated gas itself reacts with metal forming deposits and polymer forming deposits within the chamber of an ion source. In particular, it is believed that the oxygenated gas reacts with polymer forming precursors, as for example the formation of $GeF_2$ radicals when employing a $GeF_4$ feed source, thereby reducing polymeric deposits on the filament. Further, it is believed that the oxygenated gas is also ionized and the resulting ionized species from the oxygenated gas also reacts with the damaging contaminants.

According to the present invention, a method for reducing contaminant formation within an ion source comprising a chamber and a filament contained therein is achieved by reacting the oxygenated gas with deposit forming contaminants. The inventive method comprises reducing the pressure of the chamber from approximately $10^{-2}$ Torr to approximately $10^{-5}$ Torr and, when the proper vacuum pressure is attained, a feed material, such as germanium tetrafluoride, is metered into the chamber along with an oxygenated gas, such as carbon dioxide. In an embodiment of the present invention, the oxygenated gas comprises about 1% to about 10% by volume relative to the total volume of the combined feed material and oxygenated gas.

A DC voltage is then applied to the filament of about 10 volts to about 100 volts causing ionization of the feed material. The filament current, arc voltage and arc current is adjusted to obtain a stable flow of ions from the ion source. The filament current is adjusted from about 100 amps to about 200 amps, the arc voltage is adjusted from about 30 volts to about 90 volts and the arc current is adjusted from about 1 amp to about 10 amps. The oxygenated gas then reacts with metal forming deposits and polymer forming radicals or ions of the feed material. The oxygenated gas is also ionized in the ionization chamber and the ionized species of the oxygenated gas also reacts with polymer forming radicals or ions, or with metal forming deposits. Under normal operation, an ion source generating an ion beam from a $GeF_4$ feed material can be operated to give approximately 20 hours of beam time. The present invention increases the beam time by about 2 to about 5 fold, e.g., no less than about 40 hours to about 100 hours or more of beam time by introducing from about 1% to about 10% of carbon dioxide.

The present invention enables the manufacture of semiconductor devices, particularly logic and semiconductor memory devices, having sub-micron features. For example, an impurity diffusion layer, such as source and drain regions of memory and logic devices, can be formed by adding boron and phosphorus to a semiconductor substrate. Also, the contact resistance of a diffusion layer can be lowered by implanting Ge ions into a silicon substrate to engineer the conductive properties. Many additional fabrication steps can be further performed to complete the integrated circuit, including forming an oxide or nitride insulating layer over the entire wafer, forming contact openings and to the source, and drain regions, followed by forming pathways of conductive materials to provide a conductor network for connecting the various devices on the wafer into an overall integrated circuit.

The present invention advantageously enables manufacturing deep-submicron devices, such as sub 0.1 micron devices, with improved device throughput in a simplified manner. The present invention is applicable to manufacturing various types of semiconductor devices, particularly semiconductor devices having a design rule of less than about 0.18 micron.

In the previous description, numerous specific details are set forth, such as specific materials, structures, chemicals, processes, and the like, to provide a better understanding of the present invention. However, the present invention can be practiced without resorting to the details specifically set forth. In other instances, well-known processing structures have not been described in detail to avoid unnecessarily obscuring the present invention.

Only the preferred embodiment of the invention and but a few examples of its versatility are shown and described in the present disclosure. It is to be understood that the invention is capable of use in various other combinations and environments and is capable of changes and modifications within the scope of the inventive concept as expressed herein.

What is claimed is:

1. A method for reducing contaminant formation within an ion source comprising a chamber and a filament contained therein, the method comprising:

reducing the pressure of the chamber;

introducing a silicon or germanium containing feed material to the chamber;

introducing an oxygenated gas to the chamber;

applying electrical power to the filament to form ions of the feed material; and reacting the oxygenated gas with deposit forming contaminants in the chamber.

2. The method of claim 1, comprising reacting the oxygenated gas with polymer forming radicals or ions.

3. The method of claim 1, comprising reacting the oxygenated gas with metal forming deposits.

4. The method of claim 1, comprising applying electrical power to the filament further forming ions of the oxygenated gas.

5. The method of claim 4, comprising reacting the ions of the oxygenated gas with polymer forming radicals or ions, or with metal forming deposits.

6. The method of claim 1, comprising supplying an oxygenated gas selected from the group consisting of: $CO$, $CO_2$, $SO_2$, $NO$, $N_2O$ and $O_2$.

7. The method of claim 1, comprising supplying from about 1% to about 10% by volume of the oxygenated gas.

8. The method of claim 1, further comprising:

introducing the feed material together with the oxygenated gas source to the reduced pressure chamber; and extracting the ions from the chamber.

9. The method of claim 8, comprising supplying from about 1% to about 10% by volume of the oxygenated gas relative to the total volume of the combined feed material and oxygenated gas.

10. The method of claim 8, comprising operating the ion source for a beam time of no less than twice the normal beam operating time.

11. The method of claim 8, comprising operating the ion source for a beam time of no less than about five times the normal operating beam time.

12. The method according to claim 11, comprising operating the ion source for a beam time of at least about 40 hours.

13. The method of claim 8, comprising applying from about 100 amps to about 200 amps of current to the filament.

14. The method of claim 1, comprising introducing a feed material selected from the group consisting of silicon tetrafluoride and germanium tetrafluoride.

15. A method of manufacturing a semiconductor device, the method comprising:

operating an ion source in accordance with claim 1; and implanting ions in a semiconductor substrate.

16. The method of claim 1, comprising introducing a germanium halide as the feed material.

17. The method of claim 16, comprising supplying carbon dioxide as the oxygenated gas.

* * * * *